(12) United States Patent
Van Der Laan et al.

(10) Patent No.: US 6,710,856 B2
(45) Date of Patent: Mar. 23, 2004

(54) METHOD OF OPERATING A LITHOGRAPHIC APPARATUS, LITHOGRAPHIC APPARATUS, METHOD OF MANUFACTURING A DEVICE, AND DEVICE MANUFACTURED THEREBY

(75) Inventors: Hans Van Der Laan, Veldhoven (NL); Marcel Dierichs, Venlo (NL); Hendrikus Robertus Marie Van Greevenbroek, Eindhoven (NL); Markus Franciscus Antonius Eurlings, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/943,088

(22) Filed: Aug. 31, 2001

(65) Prior Publication Data

US 2002/0027648 A1 Mar. 7, 2002

(30) Foreign Application Priority Data

Sep. 1, 2000 (EP) .............................................. 00307558

(51) Int. Cl.$^7$ ........................ G03B 27/72; G03B 27/68; G03B 27/42; G03B 27/52
(52) U.S. Cl. ............................. 355/71; 355/52; 355/53; 355/55

(58) Field of Search ................................ 355/52–53, 55, 355/67–71; 356/399–401; 250/492.2, 492.22, 548

(56) References Cited

U.S. PATENT DOCUMENTS

| | | | | |
|---|---|---|---|---|
| 5,846,678 A | * | 12/1998 | Nishigori et al. .............. | 430/30 |
| 5,925,887 A | * | 7/1999 | Sakai et al. .................. | 250/548 |
| 6,040,894 A | * | 3/2000 | Takahashi ..................... | 355/53 |
| 6,118,516 A | * | 9/2000 | Irie et al. ........................ | 355/53 |
| 6,333,777 B1 | * | 12/2001 | Sato ............................. | 355/53 |
| 6,353,231 B1 | * | 3/2002 | Golladay et al. ............ | 250/347 |

FOREIGN PATENT DOCUMENTS

| | | |
|---|---|---|
| EP | 0 526 242 | 2/1993 |
| EP | 0 689 099 | 12/1995 |

* cited by examiner

*Primary Examiner*—Henry Hung Nguyen
(74) *Attorney, Agent, or Firm*—Pillsbury Winthrop LLP (57) ABSTRACT

A method of operating a lithographic projection apparatus including forming a spot of radiation at the wafer level using a pinhole at reticle level. A sensor is defocused with respect to the spot such that it is spaced apart from the wafer level. The sensor is scanned beneath the spot to measure the angular intensity distribution of radiation at the spot and to determine the intensity distribution at the pupil plane of the projection lens system.

26 Claims, 8 Drawing Sheets

METHOD OF OPERATING A LITHOGRAPHIC APPARATUS, LITHOGRAPHIC APPARATUS, METHOD OF MANUFACTURING A DEVICE, AND DEVICE MANUFACTURED THEREBY

BACKGROUND OF THE INVENTION

1. Field of the Invention

The present invention relates generally to lithographic projection systems and more particularly to lithographic projection systems incorporating an intensity distribution sensor.

2. Background of the Related Art

For the sake of simplicity, the projection system may hereinafter be referred to as the "lens"; however, this term should be broadly interpreted as encompassing various types of projection system, including refractive optics, reflective optics, and catadioptric systems, for example. The radiation system also includes components operating according to any of these design types, and such components may also be referred to below, collectively or singularly, as a "lens".

The radiation system as well as the projection system generally comprise components for directing, shaping or controlling the projection beam of radiation. Generally, the projection system comprises means to set the numerical aperture (commonly referred to as the "NA") of the projection system. For example, an aperture adjustable NA-diaphragm is provided in a pupil of the projection system. The radiation system typically comprises adjusting means for setting the outer and/or inner radial extent (commonly referred to as σ-outer and σ-inner, respectively) of the intensity distribution upstream of the mask (in a pupil of the radiation system).

In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described, for example, in U.S. Pat. No. 5,969,441 and WO 98/40791, incorporated herein by reference.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (which may comprise one or more dies) on a substrate (silicon wafer) which has been coated with a layer of photosensitive material (resist). In general, a single wafer will contain a whole network of adjacent target portions which are successively irradiated via the reticle, one at a time. In one type of lithographic projection apparatus, each target portion is irradiated by exposing the entire reticle pattern onto the target portion at once; such an apparatus is commonly referred to as a wafer stepper or just "stepper". In an alternative apparatus—which is commonly referred to as a step-and-scan apparatus or "scanner"—each target portion is irradiated by progressively scanning the reticle pattern under the (slitted) projection beam in a given reference direction (the "scanning" direction) while synchronously scanning the wafer table parallel or anti-parallel to this direction; since, in general, the projection system will have a magnification factor M (generally <1), the speed V at which the wafer table is scanned will be a factor M times that at which the reticle table is scanned. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although the spatial distribution of projection beam radiation at wafer level is measured accurately in a lithographic projection apparatus, the angular distribution is generally not monitored. Consequently, properties of the performance of the projection system, such as angular dependent lens transmission are unknown. Similarly, the projection system comprises a pupil. The spatial intensity distribution at this pupil is related to the angular intensity distribution at the reticle and the wafer. The spatial intensity distribution at said pupil is, in practice, very difficult to measure in situ and sufficiently fast (such as to not substantially impair the number of substrates that can be processed per unit of time), but potentially contains valuable information relating to the alignment, performance and optimisation of the lithographic projection apparatus. Conventional techniques which measure the intensity distribution at wafer level or reticle level do not enable an assessment of specific (residual) positional and angular alignment errors of corresponding specific optical components. These techniques can also be highly dependent on the σ-outer and σ-inner settings, which means that many measurements must be taken and an alignment procedure for said specific optical components is time-consuming.

Accordingly, the present invention provides a method of operating a lithographic projection apparatus comprising:
  a radiation system, for providing a projection beam of radiation;
  a first object table for holding a mask at a mask plane;
  a second object table for holding a substrate at a substrate plane; and
  a projection system for imaging at least a portion of the mask onto target portions of the substrate;

the method characterized by comprising the steps of:
forming at least one spot of radiation from at least a portion of said projection beam in said apparatus;
providing at least one radiation sensor, embodied for real time electronic analysis of an intensity distribution;
measuring, with said at least one sensor, the spatial variation in intensity of defocused radiation from said spot or from an image of said spot; and
determining properties of said apparatus from information obtained in said measuring step.

This method enables properties of the pupil in the projection system to be determined and the angular intensity distribution property of the apparatus to be determined.

The or each spot may be formed at at least one of the mask plane and the substrate plane.

The or each spot may be formed by using a substantially transmissive or substantially radiation blocking pinhole.

The method may further comprise generating radiation at particular angles using, at the or each spot, at least one radiation manipulation effect selected from the group of radiation manipulation effects comprising diffraction, scattering and diffusion of radiation.

By diffracting radiation at large angles the NA-diaphragm size and shape can be determined. Instead of diffraction effects, scattering or diffusion of radiation can be used to generate radiation at large angles. Scattering of radiation occurs, for example, when the projection beam traverses a rough surface. Similarly, diffusion of radiation occurs, for example, when the projection beam traverses a translucent element.

The properties of said apparatus may include at least one of:
for a pupil in said apparatus, the shape, symmetry, fine structure and/or centering of the angular intensity distribution with respect to an NA-diaphragm,
the shape and/or size of an NA-diaphragm in said apparatus,
the angular dependence of radiation transmission in said projection system,
the angular intensity distribution at the mask plane and/or substrate plane,
the alignment of optical components in said apparatus, in particular the positional and angular alignment of the source of radiation, and
any one or more of the above properties at different positions in the mask plane and/or substrate plane, and/or at different illumination settings of said apparatus.

The method may further comprise the step of adjusting the apparatus to correct or compensate for deviation from optimal of any of the determined properties. Said step of adjusting the apparatus may substantially reduce image anomalies of a projected pattern, improve the accuracy of the positioning in registry of stacked layers of a device (referred to hereinafter as the "overlay performance"). Said step may also improve the uniformity, within a target portion, of the critical dimension. The critical dimension is the dimension of a feature or features, such as the gate width of a transistor, in which variations will cause undesirable variation in physical properties of the feature. Said uniformity of the critical dimension is referred to in this text as "CD uniformity".

The invention also provides a lithographic projection apparatus for imaging a mask pattern in a mask onto a substrate provided with a radiation-sensitive layer, the apparatus comprising:

a radiation system, for providing a projection beam of radiation;
a first object table for holding a mask at a mask plane;
a second object table for holding a substrate at a substrate plane; and
a projection system for imaging irradiated portions of the mask onto target portions of the substrate;
characterized by further comprising:
at least one spot formation device for forming at least one spot of radiation from at least a portion of said projection beam in said apparatus; and
at least one radiation sensor, embodied for real time electronic analysis of an intensity distribution, and defocused with respect to the spot or from each respective spot, or image thereof, for measuring the spatial variation in intensity of defocused radiation from the or each spot or image thereof.

In one embodiment, said spot formation device comprises at least one substantially transmissive or substantially radiation blocking pinhole located at one of the mask plane and the substrate plane.

In another embodiment, said or each pinhole further comprises dots with a size approximately of the order of the wavelength of the projection beam of radiation, for diffracting the radiation, which enables radiation at large angles of incidence to be generated.

In another embodiment, in use, the or each sensor is spaced apart from its respective spot by a distance greater than the size of the spot.

These features enable the spot and sensor to act as a pinhole camera, which has a very simple structure, requiring few components, and which is compact.

In one aspect of an embodiment of the invention the size of the spot is approximately 1% of the image field area or less.

The at least one sensor may comprise a photodiode with small detection area or a charge-coupled device (CCD), optionally further comprising a lens. Consequently, the apparatus and method of the invention enable in situ, real time measurements of pupil intensity distribution. For this in situ measurement exposure and processing of a substrate provided with a radiation sensitive resist layer is no longer necessary. This makes the measurements rapid, quantitative and independent of resist-processing.

Likewise, said at least one sensor may be scanable to enable an image of the pupil to be obtained and enables properties of the apparatus to be determined at different field positions.

The apparatus may further comprise a calculation unit for determining properties of said apparatus from the measurements taken by the or each sensor. This enables the properties to be obtained on-line and in real time.

The apparatus may further comprise actuators for adjusting said apparatus to correct and/or compensate for deviation from optimal of any of the determined properties based on signals from said calculating unit. Thus the adjustment process is simplified and automated.

The invention further provides a method of manufacturing a device comprising operating a lithographic projection apparatus as defined above according to the method of the invention, and a device manufactured thereby.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms illumination radiation and illumination beam are used to encompass all types of electromagnetic radiation, including ultraviolet radiation (e.g. with a wavelength of 365, 248, 193, 157 or 126 nm) and EUV radiation (extreme ultraviolet radiation, e.g. having a wavelength in the range 5–20 nm).

BRIEF DESCRIPTION OF THE DRAWINGS

Embodiments of the invention will now be described, by way of example only, with reference to the accompanying drawings in which.

DETAILED DESCRIPTION

First Embodiment

Figure 1:
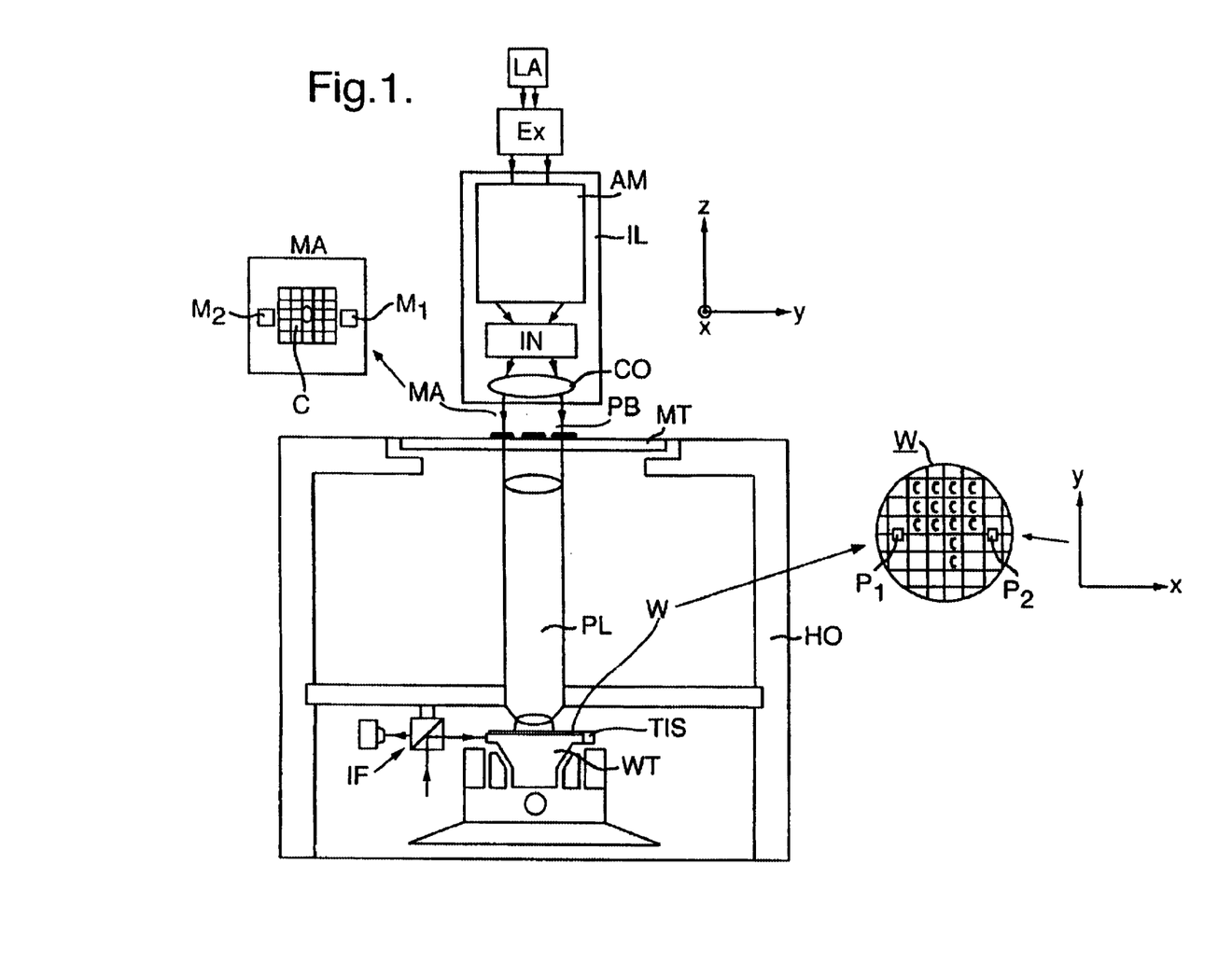
FIG. 1 depicts a lithographic projection apparatus according to a first embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. UV radiation, or radiation with wavelengths within spectral wavelength ranges substantially centered at 248 nm, 193 nm, 157 nm, 126 nm or 13.5 nm). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W. As shown in FIG. 1, mask MA is provided with alignment marks $M_1$ and $M_2$ and substrate W is provided with alignment marks $P_1$ and $P_2$ such that the substrate W and the mask can be aligned relative to each other.

As here depicted, the apparatus is of a transmissive type (i.e. has a transmissive mask). However, in general, it may also be of a reflective type, for example (with a reflective mask).

The source LA (e.g. a UV excimer laser, a laser-produced plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL comprises adjusting means AM for setting σ-outer and σ-inner, respectively, of the intensity distribution in the beam. Said adjusting means may, for instance, comprise movable axicon shaped elements to generate ring shaped intensity distributions. Such adjusting means may be referred to as "zoom-axicon module" hereinafter. In addition, the illuminator IL will generally comprise various other components, such as an integrator IN and a condenser CO. The integrator IN may, for example, be a kaleidoscopic rod, referred to hereinafter as an "integrator rod". In this way, the beam PB impinging on the mask MA has a desired uniformity and intensity distribution in its cross-section. More information with regard to an illuminator as here described can be gleaned, for example, from EP 0 747 772 A1, incorporated herein by reference.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA which is held on a mask table MT. Having traversed the mask MA, the beam PB passes through the lens PL, which focuses the beam PB onto a target portion C of the substrate W. With the aid of the interferometric displacement and measuring means IF, the substrate table WT can be moved accurately, e.g. so as to position different target portions C in the path of the beam PB. Similarly, the first positioning means can be used to accurately position the mask MA with respect to the path of the beam PB, e.g. after mechanical placement of the mask MA from a mask library, or during a scan. In general, movement of the object tables MT, WT will be realized with the aid of a long stroke module (course positioning) and a short stroke module (fine positioning), which are not explicitly depicted in FIG. 1. However, in the case of a wafer-stepper (as opposed to a step-and-scan device), it is possible that the mask table is only positioned by a short-stroke module, to provide fine movement only, or that it is just fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given reference direction (the so-called "scan direction", e.g. the y direction) with a speed v, so that the projection beam PB (which is now slit-shaped) is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

A transmission image sensor TIS can be used to determine the lateral position and best focus position (i.e. horizontal and vertical position) of the projected image from the mask under the projection lens. A transmission image sensor TIS is inset into a physical reference surface associated with the substrate table WT. In a particular embodiment, two sensors are mounted on fiducial plates mounted to the top surface of the substrate table WT, at diagonally opposite positions outside the area covered by the wafer W. Each fiducial plate is made of a highly stable material with a very low coefficient of thermal expansion, e.g. Invar, and has a flat reflective upper surface which may carry markers used with another fiducial in alignment processes. The TIS is used to determine directly the vertical (and horizontal) position of the aerial image of the projection lens. It comprises apertures in the respective surface close behind which is placed a photodetector sensitive to the radiation used for the exposure process.

To determine the position of the focal plane, the projection lens projects into space an image of a pattern provided on the mask MA and having contrasting light and dark regions. The substrate table is then scanned horizontally (in one or preferably two directions) and vertically so that the aperture of the TIS passes through the space where the aerial image is expected to be. As the TIS aperture passes through the light and dark portions of the image of the TIS pattern, the output of the photodetector will fluctuate (a Moire effect). The vertical level at which the rate of change of amplitude of the photodetector output is highest indicates the level at which the pattern image has the greatest contrast, and hence indicates the plane of optimum focus. The horizontal level at which the rate of change is highest indicates the aerial image's lateral position. An example of a TIS of this type is described in greater detail in U.S. Pat. No. 4,540,277, incorporated herein by reference. Advantages of TIS include robustness and speed, because it is a direct measurement technique not involving exposure of a resist.

Figure 2:
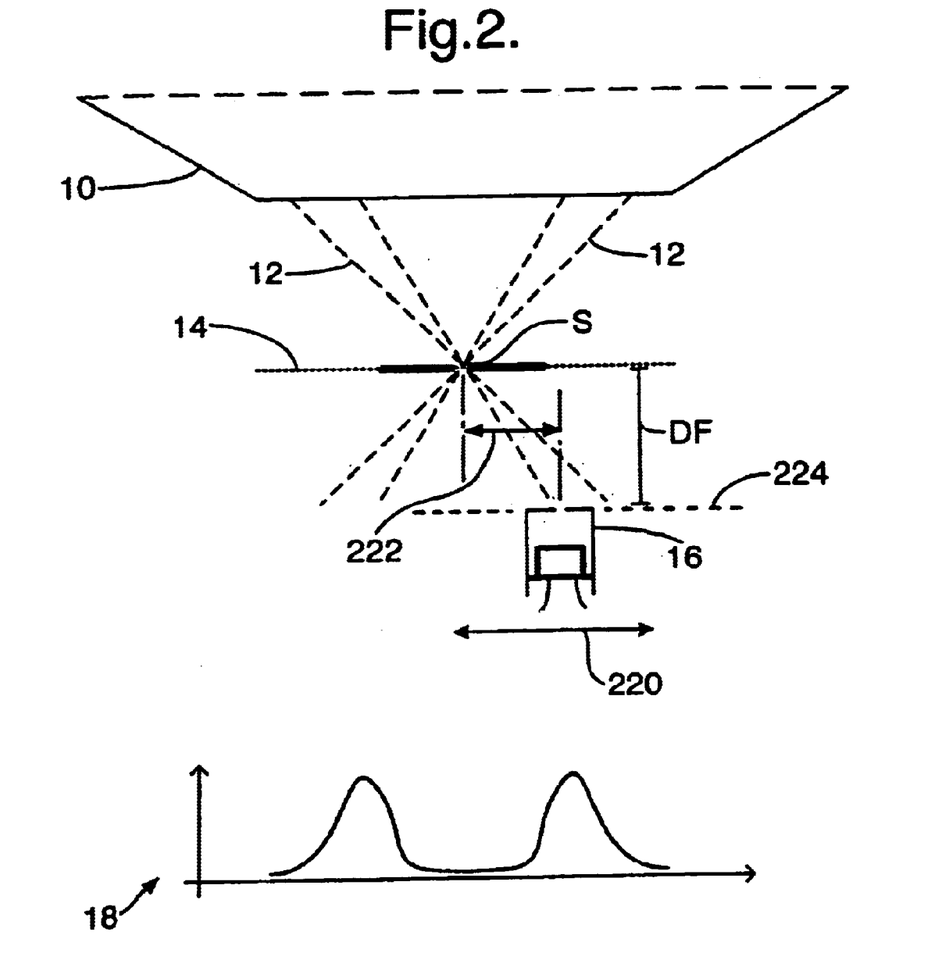
FIG. 2 is a schematic illustration of part of the lithographic projection apparatus illustrating the formation of a spot of radiation at wafer level and the measurement of the angular intensity distribution using a defocused sensor.

According to the present embodiment, a spot sensor which is part of the TIS is used, the spot sensor comprising a photodiode with an extremely small detection area. However, any other suitable spot sensor, comprising a radiation sensor with small detection area, could be used apart from sensors associated with TIS. One specific TIS comprises a square aperture with dimensions 28 μm×28 μm in front of a photodiode. FIG. 2 shows, in cross-section, the lower portion of the projection lens system 10 focusing radiation 12 down to a small spot S at wafer level 14, i.e. the plane at which, in use, a resist-coated wafer is placed during an exposure, and the plane at which the aerial image is focused. Below this plane 14 is a spot sensor or TIS 16. The sensor 16 is defocused by a distance DF from the plane 14. The plane 14 is shown edge on. The sensor 16 is scanned in a plane parallel to the plane 14, as indicated by the arrow 220 in FIG. 2, but spaced apart from it by the distance DF. The result of a scan in one lateral direction is shown schematically in plot 18. The vertical axis indicates detected intensity and the horizontal axis shows position, in one dimension, of the sensor 16 in the plane parallel to the plane 14. Alternatively, the position in the plane parallel to plane 14 can be converted to give the angle θ that the radiation at that position makes to the line perpendicular to the plane 14 and passing through the spot S, according to the equation:

$$\theta = \text{Arctan}(r/DF)$$

where r is the lateral displacement 222 of the sensor from the point directly beneath spot S. In this way, the horizontal axis can be the angle θ, and thus the plot 18 represents an angular intensity distribution of the radiation at wafer level at the spot S.

As shown in FIG. 2, the illumination mode is annular (or dipolar in the plane of the cross-section), such that in the scan plotted at 18 there are two intensity peaks either side of a low-intensity region (corresponding to reduced intensity at angles on and close to normal incidence to the wafer plane 14).

This invention works on the principle of a pinhole camera or camera obscura. By passing the radiation through a small spot, an image can be formed without the use of a lens. In this embodiment, an image of the pupil plane in the projection lens system is formed at the plane 224 of the sensor 16. The operation of this embodiment can also be understood by considering that passing the radiation through a small spot S localises the radiation spatially, and, therefore, when detected at the sensor 16 spaced apart from the spot S by a distance DF, the information obtained, under ideal conditions, relates purely to the angular distribution of the radiation.

Although described above with reference to the plane 224 of the sensor 16 being located below the wafer level 14, as shown in FIG. 2, embodiments of the invention work equally well with the sensor 16 located above the plane 14 by a particular defocus distance. The spot S shown in FIG. 2 is, in effect, merely an image of a spot which is actually formed at the focal plane of the illuminator, at mask level, at the entrance to the projection lens. The measurement by the sensor can be performed with the sensor defocused with respect to the spot image, and the defocus can be either positive or negative, i.e. above or below the wafer level 14.

In a further variant, the spot (or object such as a mask defining a spot) can be displaced from the object focal plane at the entrance to the projection lens. For example, a quartz reticle, with a chromium pattern on one surface defining a pinhole, can be turned upside-down so that the pinhole is displaced from the focal plane along the optical axis by a distance equal to the thickness of the reticle. In this way, there is no longer a focused imagine of the spot at the wafer level, so the sensor 16 can, in fact, be located at the plane corresponding to wafer level, i.e. the focal plane of the projection lens. In this variant, the sensor will be defocused with respect to a spot or image of a spot, even though the sensor is at the focal plane of the projection lens. This defocus of the sensor is a requirement common to different embodiments of the present invention.

In a pinhole camera, the pinhole size is preferably larger than the wavelength of the radiation, in order to avoid or reduce unwanted diffraction effects. The distance between pinhole and image should also be much larger than the pinhole diameter to obtain a sharp image. The on-axis angular resolution of this type of camera is given by an angle defined by Arctan(pinhole diameter/pinhole-to-image distance).

In one practical embodiment of the invention, the sensor 16 was defocused by approximately 0.5 mm, that is, referring to FIG. 2, the distance DF between the pinhole and the image. The effective diameter of the pinhole is approximately 0.02 mm. This is the "effective" diameter given by a convolution of the spot with the size of the sensor. From this, the ratio of the distance between pinhole and image to the effective pinhole diameter is greater than 20, but the sensor is not completely in the far-field of the pinhole and so the angular resolution is limited to approximately 2°, given by the above expression, in this particular embodiment.

Figure 3A:
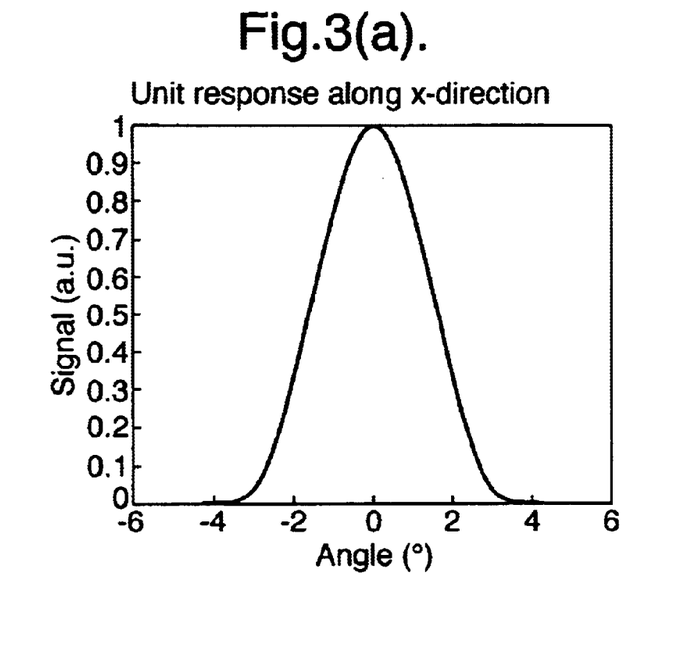
FIGS. 3(a) and (b) are graphs illustrating the angular resolution of the measurement technique in two perpendicular directions.
Figure 3B:
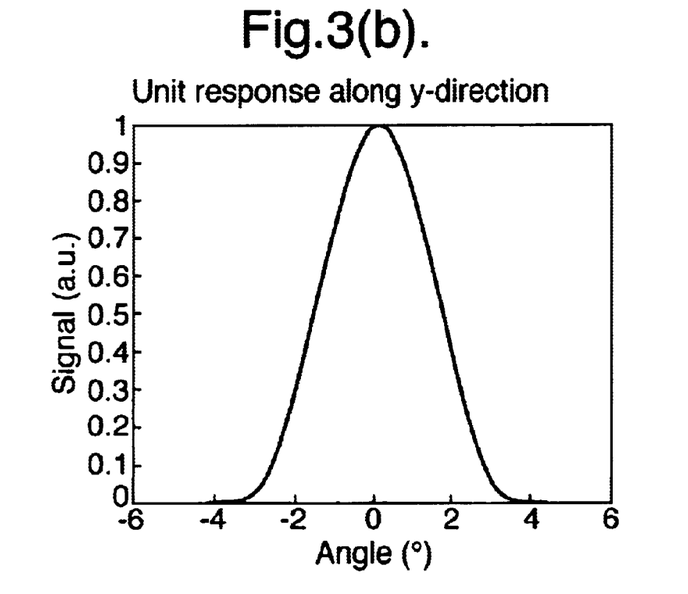

The angular resolution has been verified experimentally for this embodiment by measuring the size of the spot S. This was done by scanning the sensor 16 at the focal plane 14 of the spot (unlike the method of this invention in which the sensor is defocused from the focal plane 14 of the spot S). Note that the focal plane of the spot S is not necessarily the same as the wafer level used during exposure; it depends on whether or not the object forming the spot is at the object plane of the projection lens. The resulting plots of scans in the x-direction and y-direction are given in FIGS. 3($a$) and 3($b$) respectively. The vertical axes are normalised intensity in arbitrary units. Rather than plotting the size of the spot in millimeters, the horizontal axes have been converted into an angle in degrees that would be obtained for a defocused distance DF of 0.5 mm, the distance as used, for example, for the measurement of FIG. 5. As can be seen from FIGS. 3($a$) and ($b$) the angular resolution, in both the x-direction and in the y-direction, is approximately 2°.

The angular resolution of the measuring system of the present invention in fact improves away from normal incidence, that is the angular resolution is better at larger angles θ. Improvement in angular resolution means that the minimum angle that can be resolved is smaller.

Figure 4:
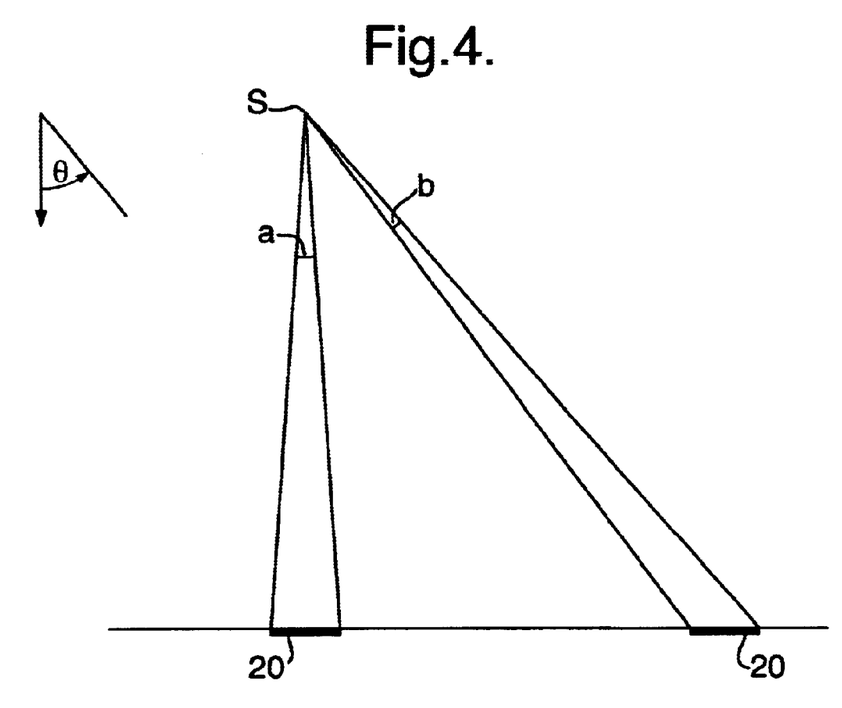
FIG. 4 is a schematic diagram to illustrate the change in resolution when the sensor moves off-axis.

The change in angular resolution when the sensor moves off-axis is illustrated in FIG. 4. The angle b subtended by a sensor 20, when off-axis, is smaller than the angle a subtended by the sensor 20 when directly beneath the spot S. The improvement in resolution, i.e. decrease in angles subtended, varies as a function of $\cos^2 \theta$. This arises from two contributions, resulting from the arrangement, in the lithographic projection apparatus in which the sensor 20 moves in a particular plane. As the sensor 20 moves off-axis, the distance between the spot S and the sensor increases with $1/\cos \theta$ and the fact that the detection surface of the sensor is constrained to move in a plane means that it is not always perpendicular to the radial direction from the spot S, and this leads to an apparent decrease in the dimension of the sensor 20 by a further factor of $1/\cos \theta$.

Furthermore, the intensity measured at the sensor decreases as a function of $1/\cos^3 \theta$. For a point source S, the intensity decreases as the inverse square of the radial distance, which leads to a factor of $1/\cos^2 \theta$, and the further $1/\cos \theta$ factor arises, as above, from the fact that the detection surface of the sensor is constrained to the plane and so is not normal to the radius vector from the spot S. In effect, this means that the angular intensity sensitivity of the sensor decreases as $1/\cos^3 \theta$.

The above angular resolution and intensity changes can be taken into account when performing quantitative measurements of the projection system.

Figure 5:
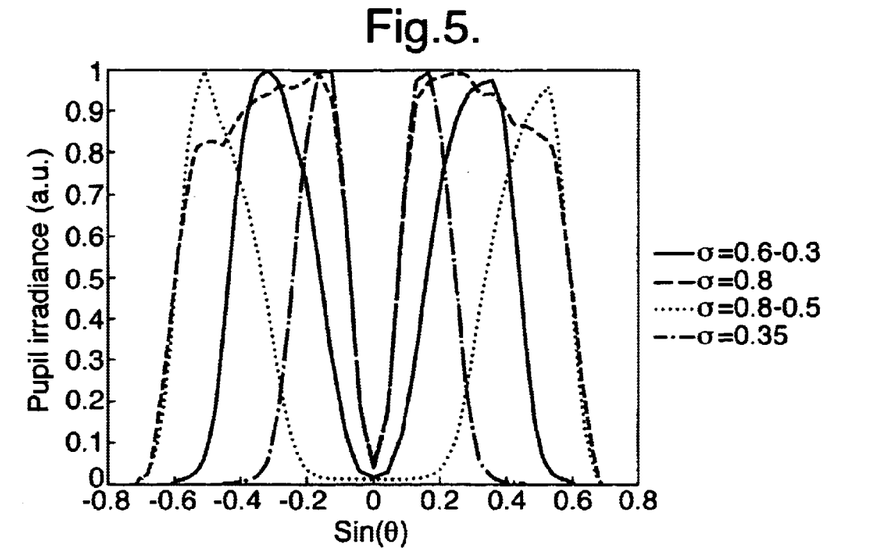
FIG. 5 is a graph showing plots of the angular intensity distribution at several different illumination settings.

FIG. 5 shows four plots of angular intensity distribution for different illumination settings. The vertical axis is of normalised intensity in arbitrary units and the horizontal axis is the sine of the angle θ in degrees, for a line-scan in the y-direction. The σ setting refers to the radial extent of the intensity distribution in the plane of the pupil, normalised with respect to the maximum radius of the pupil. Thus, a σ value of 1 represents illumination with an intensity distribution having a radius at the pupil equal to the maximum radius of the pupil. In the key to the graph of FIG. 5, a single σ value refers to the outer radius of a conventional (i.e. disc-like) illumination mode, and two σ values refer to the outer and inner radii of an annular illumination mode. The measurements of FIG. 5 were all performed at a fixed NA setting of 0.60.

As can be seen from FIG. 5, because of the way the illumination settings are generated, there is reduced intensity at small angles, even for conventional illumination modes. For example, the plot for σ=0.35 shows a double-peak structure. This is caused by the presence, in the centre of the projection beam, of, for example, prisms (such as in a so-called axicon), which redistribute the radiation, and hence cause the intensity reduction at the centre of the pupil.

There are various possible ways of generating the spot S. Referring to FIG. 2, one embodiment would be to place a plate with a pinhole aperture at the plane 14 such that the pinhole defined the spot S. However, it is important to realise that it is not essential to have a physical structure at the wafer plane 14, so for example, the same result could be achieved by placing a pinhole at the reticle plane, and then the projection lens will produce a focused image of the pinhole at the wafer plane 14 to form a localised spot of radiation S.

The term pinhole used herein simply refers, in one instance, to a small substantially transmissive region surrounded by a substantially non-transmissive region, so should not necessarily be given its literal meaning. One embodiment comprises a metal plate or foil with an aperture in it. However, it is not necessary for there to be a physical hole, i.e. an absence of material, provided that the radiation can pass through. For example, another embodiment comprises a transparent plate, for example made of quartz, on which there is a thin layer of chromium in which there is one or more gaps defining regions through which projection beam radiation can pass. This is the normal form of a reticle or mask and can be fabricated using known etching techniques.

Conversely, the term pinhole, in another instance, can refer to a small substantially non-transmissive region surrounded by a substantially transmissive region, i.e. like a photographic negative of the first described pinhole. According to diffraction theory, a small non-transmissive region can focus radiation in the same way as a small transmissive region. Both examples are to understood as being within the scope of the present invention.

The spot, whether created by a pinhole, or otherwise, need not be circular. Non-circular spots will have different angular resolutions in different directions. The measurements actually depend upon the effective spot size and shape, given by the convolution of the spot with the detection area of the sensor. Thus the same effects can be obtained by selecting the shape of the aperture of the transmission image sensor TIS. Possible shapes for the spot, pinhole or sensor detector area include circular, elliptical, square and rectangular shapes.

A further optional feature of embodiments of the invention is that the spot or pinhole does not have to be a region of uniform transmissivity. The non-uniform transmissivity can be employed to achieve diffraction effects, including scattering, to measure, for example, the setting of said NA-diaphragm in the projection lens. By definition, the (setting of the) NA-diaphragm defines the extreme edge of the pupil and the maximum angular ray that can pass through the projection lens. The NA-diaphragm setting can only be measured if the NA-diaphragm is illuminated. Consequently, radiation with large angles is required, and one way of generating this, according to the present invention, is by diffraction at the reticle level.

Figure 6:
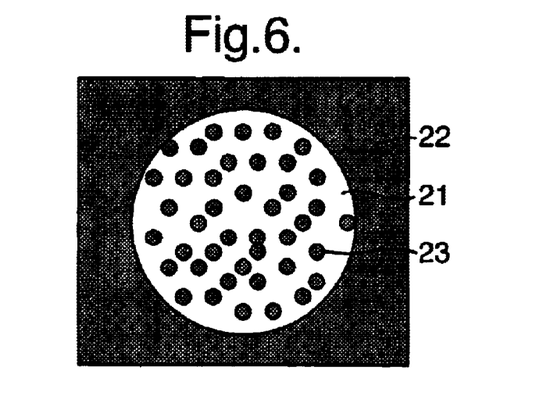
FIG. 6 is a schematic illustration of a pinhole with subsidiary dots for diffraction of radiation to larger angles.

For example, as shown in FIG. 6, the pinhole 21 surrounded by the non-transmissive region 22 includes subsidiary non-transmissive dots 23. In this example the dots 23 are located in a random array. The subsidiary dots 23 are of size approximately equal to the wavelength of the radiation. The dots cause impinging radiation to be diffracted to a wide range of angles such that the whole pupil in the projection lens can be illuminated and measured. FIG. 6 is not to scale. In a preferred embodiment, the diameter of the pinhole 21 is approximately 25 μm and the diameter of each dot 23 is in the region of 0.2 μm. In another embodiment, a diffuser in conjunction with a pinhole is used to obtain radiation at large angles like with the dots 23.

Figure 7:
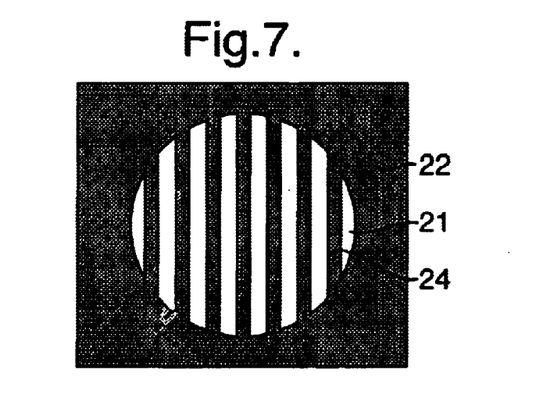
FIG. 7 is a schematic illustration of a pinhole including a diffraction grating for diffraction of radiation to larger angles.
Figure 8:
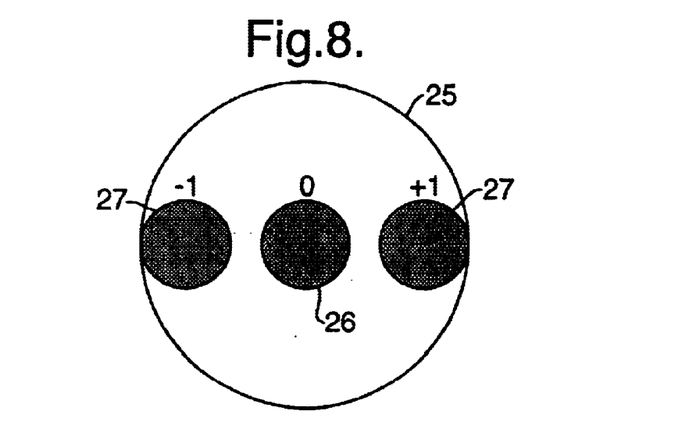
FIG. 8 is a schematic illustration of a pupil intensity distribution with respect to an NA-diaphragm in the projection lens system resulting from the pinhole of FIG. 7.

A further embodiment of this principle is shown in FIG. 7. A pinhole 21 surrounded by a non-transmissive region 22 includes a grating 24 comprising alternate transmissive and non-transmissive stripes to produce well defined diffraction. FIG. 8 illustrates schematically a diffraction pattern at the pupil plane in the projection lens resulting from the grating-pinhole 21, 22, 24 of FIG. 7. In FIG. 8, the pupil is bounded by the NA-diaphragm 25. The $0^{th}$-order beam intensity distribution 26 corresponds to the angular distribution of projection beam radiation falling on the reticle plane, where the pinhole is located. In this illustration, the $0^{th}$-order beam is shown small for clarity; in practice it can overlap the $1^{st}$-order diffracted beams 27, which can themselves overlap the NA-diaphragm periphery 25. Different illumination settings can also be used such that the beams 26, 27 may be annular, multipolar and so on.

As well as probing the size and shape of the NA-diaphragm, this arrangement can also be used to measure the angular dependent lens transmission. The expected ratio between the intensity at each point in the $0^{th}$ order and its corresponding point in the $1^{st}$ order is known from the diffraction efficiency of the grating. By measuring the actual intensity ratio, a deviation from the expected ratio can be calculated, and thus the lens transmissivity for different angles can be obtained. By varying the diffraction pattern and the illumination settings, the angular dependence of the lens transmission can be determined at one field point. This measurement can be performed at many field positions i.e. corresponding to pinholes at different positions in the reticle plane.

Alternatively, the angular distribution can be measured at both reticle and wafer level. The difference between both measurements, taking into account the magnification factor of the lens, gives the angular dependent lens transmission.

In an other embodiment, said angular dependent lens transmission can be measured using, instead of radiation diffracting structures, a radiation diffuser comprising a pinhole 21. The angular distribution of radiation downstream of a diffuser is substantially independent of the angular distribution of the radiation impinging on the diffuser, and hence, substantially independent of, for example, σ settings. Generally, a diffuser transforms incoming radiation into radiation with an angular distribution substantially in accordance with the radiation provided by a Lambertian radiation source. Any deviations from this property can be measured and stored for reference. The angular dependent lens transmission can be calculated from the difference between the measured angular radiation distribution at substrate level and the a-priory known Lambertian radiation distribution (taking into account said deviations stored for reference, and the magnification factor of the lens).

Above, embodiments have been described in terms of non-transmissive dots or stripes in a transmissive pinhole. It is also envisaged that the complement of these be used, i.e. transmissive dots or stripes in a non-transmissive region surrounded by a transmissive region. In fact the dots or stripes merely need be differently transmissive from the pinhole, such as diffusive or phase-shifting, to obtain desired diffraction effects.

The subsidiary dots or diffuser or grating can be made at the same plane as the pinhole, for example as a mask with chromium layer defining the non-transmissive regions, such as dots or stripes and the region surrounding the pinhole. However, it is also envisaged that the diffracting element (dots, grating, diffuser and so on) be provided slightly above or below the plane of the pinhole. For example, one mask can define the basic pinhole and another mask placed underneath or on top can define the dots or grating etc. The various masks and diffusers are interchangeable so that many combinations can be achieved without having to fabricate a specific mask for each one.

Figure 9:
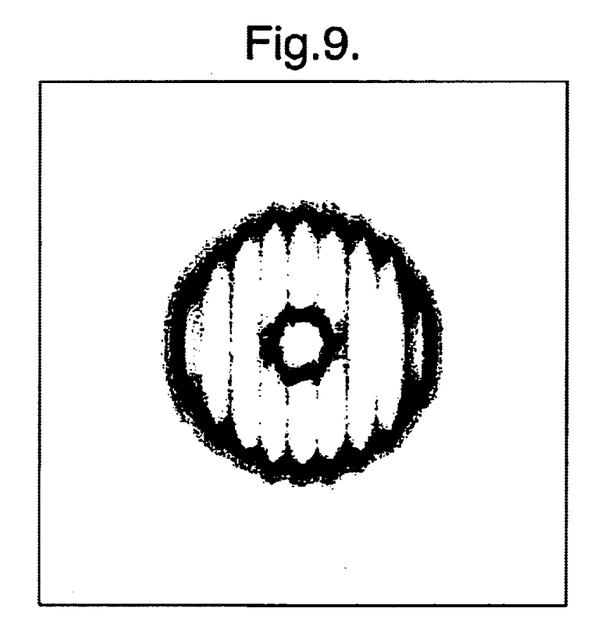
FIG. 9 is an image of the pupil showing a fine structure.

One mode of operation of an embodiment of the present invention is to perform a line-scan as shown in FIG. 5 to obtain angular intensity distribution information. Another mode of operation according to an embodiment of the invention is to scan the sensor over the x–y plane at the defocused distance DF. An image of such a plot is shown in FIG. 9. This corresponds to an image of the intensity distribution at the pupil plane in the projection lens system. FIG. 9 clearly shows fine structure in the spatial intensity distribution at the pupil, comprising alternate stripes with high and low intensity.

With either of these modes of operation, information can be determined on:

1. pupil symmetry, comprising the shape and intensity of the radiation distribution at the pupil, including fine structure;
2. the centering of the angular intensity distribution with respect to the NA-diaphragm;
3. the size and shape of the NA-diaphragm itself can be measured;
4. angular dependent lens transmission can also be measured;
5. specific errors which are characteristic of certain imperfections in the illumination system. For example, in a plane proximal a pupil of the radiation system or the projection system, either the projection beam cross-section may be elliptical rather than circular, or the projection beam intensity distribution within the projection beam cross-section may, for instance, be elliptically symmetric rather than circularly symmetric. Both types of errors are referred to as "ellipticity of the projection beam" or simply as "ellipticity error". An ellipticity error may be the result of a polluted integrator rod, or of imperfections in other optical elements in the illuminator. For more information on ellipticity error, see for example, European Patent Application 01305740.1, incorporated herein by reference.

Each of the above measurements can be performed at a plurality of different field positions to obtain, for example, the variation in angular intensity distribution across the field.

One way to do this is to provide a reticle with a plurality of pinholes, each at a different desired field position. If the reticle is placed at the entrance of the projection lens system, the projection lens produces an image of each of these pinholes as a set of spots at wafer level. Alternatively, the reticle may be placed at wafer level to form the spots directly. A sensor, such as a dedicated sensor or a pre-existing transmission image sensor TIS, is then used to obtain measurements at a position defocused from each spot. A single sensor can scan the far-field pattern of each of the spots in turn, and/or a plurality of sensors can be provided, corresponding to the different field positions of the pinholes and spots.

Following these measurements, corrections can be applied to the lithographic projection apparatus to compensate for alignments and symmetries that are not optimal. For example, the intensity distribution at the pupil should ideally be mirror symmetric about an axis traversing the centre of the pupil. By determination of the fine structure of the pupil image a software algorithm can be used to detect any asymmetry and compensate this with beam steering to optimise the symmetry. This can improve both the fidelity of a projected image and the overlay performance.

Similarly, by minimising the variation in angular intensity distribution over the image field, the CD uniformity can be improved and the magnitude of the contribution to the CD uniformity of each of the above factors can be investigated.

The fine structure of the pupil also enables the position, shape and alignment and other properties of the illumination source to be analysed. A further way of doing this is explained in the embodiment below.

Second Embodiment

Figure 10:
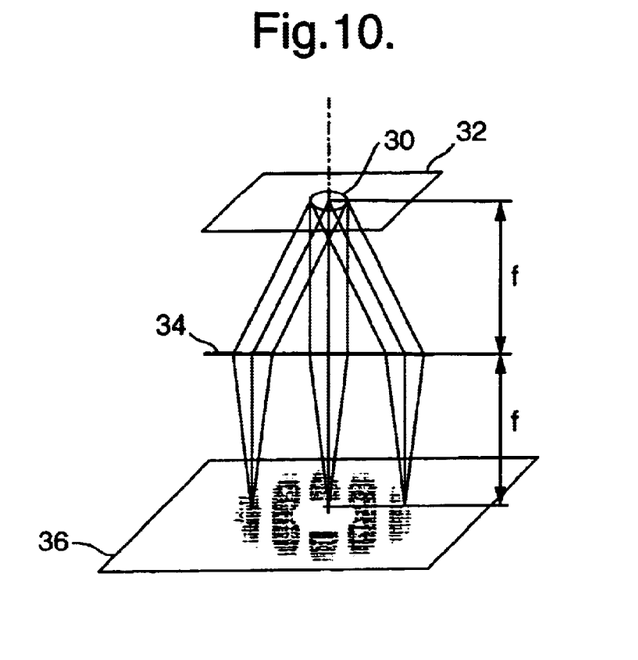
FIG. 10 is an illustration of a further embodiment, for angular intensity distribution and pupil measurement in a lithographic projection apparatus, using a pinhole.

FIG. 10 illustrates a second embodiment for measuring the angular intensity distribution at a field plane, such as at reticle level or wafer level, or, equivalently, measuring the intensity distribution in the plane of a pupil, such as a pupil in the illumination system or in the projection lens system. A pinhole, i.e. small transmissive region or small non-transmissive region, 30 is provided at a field plane 32. A lens 34 transforms the angular distribution at the field point selected by the pinhole into an intensity distribution at a sensor 36. The sensor 36 comprises a charge-coupled device (CCD) which has an array of radiation sensitive pixels. Thus an electronic image of the pupil is obtained.

As explained with reference to the first embodiment, an image can be formed by a pinhole alone without the use of an additional lens. However, the lens 34 in the present embodiment makes the image more compact, thereby reducing the area of the CCD chip that is required. The use of a CCD enables the pupil image to be captured in a single shot, without scanning.

According to the present embodiment, a software algorithm is used to evaluate the global pupil properties, such as intensity and centring, to evaluate the pupil symmetry, such as the ellipticity error, and to evaluate the pupil fine structure characteristics. These evaluations are then used to perform real-time online adjustments.

The radiation system of a lithographic projection apparatus typically comprises a radiation source, such as a laser, an illumination system for providing a substantially collimated beam, for integrating the radiation for homogeneity and for defining the illumination mode. These separate components must be joined together with accurate positional and angular alignment. The present embodiment of the invention is particularly useful for ensuring accurate alignment. For example, the pupil information can be used as a control signal for the laser adjustment. Laser beam angular alignment errors are referred to as "laser pointing errors" hereinafter. The fine structure of the pupil gives information about the origin of the alignment errors enabling separation of laser pointing errors from laser beam positional errors as well as alignment errors of the zoom-axicon module (for defining the illumination mode) relative to the integrator rod. By separating these errors it is possible to identify and apply a correction to the appropriate component.

Figure 11:
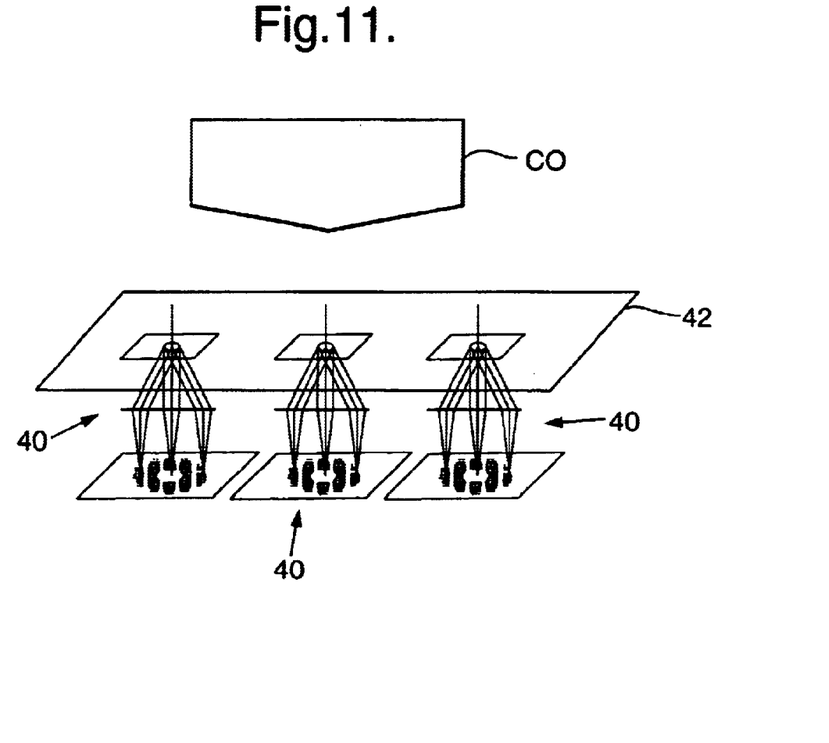
FIG. 11 illustrates a further embodiment using three of the pinhole devices shown in FIG. 10.

A further preferred embodiment of the invention is shown in FIG. 11. This comprises three pupil measurement tools each as illustrated in FIG. 10. The pinholes of each of these tools are located at reticle level in the lithographic projection apparatus. One is in the centre of the field and the others are at the two edges of the field in the x-direction. The reticle level 42 is below a condenser lens CO of the illumination system.

The three tools 40 detect the pupil image simultaneously. The pupil ellipticity is calculated for each of the three field positions based on the three measured pupil images. In an optimally adjusted system, the pupil ellipticity is symmetric to the axis through the centre of the field. A laser pointing error results in ellipticity values larger than unity on one edge of the field and smaller than unity on the other. If the ellipticity at these field points is unequal, the laser pointing is varied until the ellipticity values are equal. For greater accuracy, the measurements can be performed repeatedly for different illumination settings.

Laser beam position errors influence the fine structure of the pupil, such as the spacing of the strips (see for example FIG. 9). If the strip spacing is evaluated for one small and one large σ setting (for a conventional illumination mode), the effect of a laser beam position error can be separated from alignment shifts between the zoom-axicon module and the integrator rod. By performing these adjustments, the laser beam can be optimised both positionally and angularly.

There are some pupil errors that are independent of adjustments of the optical components and therefore have to be compensated. Such errors can be induced, for example, by divergent laser beams or integrator rod-induced ellipticity error. For adjustment-independent pupil errors, such as ellipticity errors, possible compensations are: to correct the ellipticity using a static or dynamic pupil grey tone filter or with a rotatable optical element featuring an intrinsic ellipticity error generating property which can be used to counteract an ellipticity error induced by other components traversed by the projection beam. For further information on correction of ellipticity error, see, for example, European Patent Application 01305740.1.

The ellipticity error may vary between different illumination settings. In this case, the ellipticity error can be determined using, for example, the embodiment shown in FIG. 11, for a number of different NA and σ settings during a calibration phase of the apparatus. When using the apparatus for exposures, an appropriate correction is made (for example, by a particular rotation of said rotatable optical element featuring an intrinsic ellipticity error generating property) to compensate for the ellipticity at the particular illumination setting being used for each exposure.

Third Embodiment

The above described embodiments all imply that the measurements be done at one specific position in the radiation field. However, in a step-and-scan apparatus (scanner), each position at the wafer is scanned through the whole illumination slit. During this scan, the angular radiation intensity distribution as seen by each point on the wafer changes significantly.

Figure 12A:
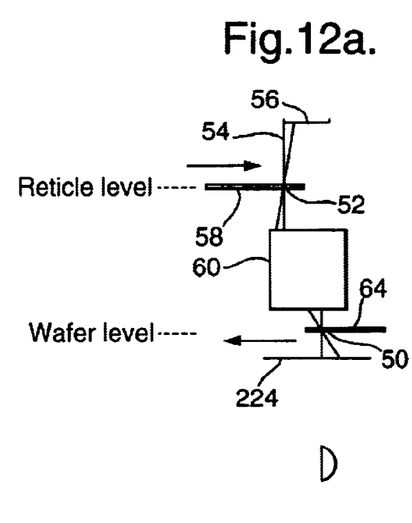
FIGS. 12(a), (b) and (c) give a schematic illustration of intensity distribution measurements in a step-and-scan apparatus.
Figure 12B:
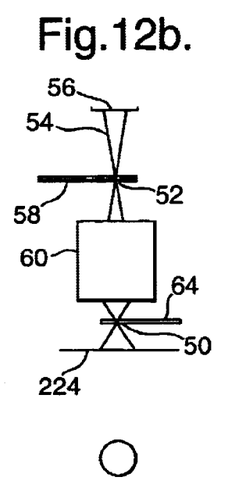
Figure 12C:
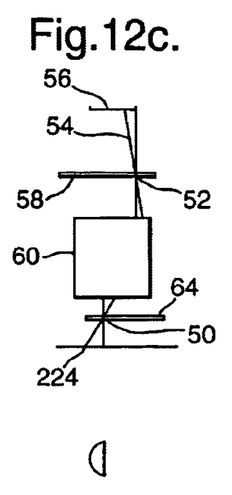

FIG. 12 illustrates the change in illumination during a scan for a particular point 50 at the wafer level corresponding to an image of a substantially circular pinhole 52 at reticle level. FIG. 12 gives three snapshots during a scan: FIG. 12(a) is just after the beginning of the scan; FIG. 12(b) is at the middle of the scan; and FIG. 12(c) is almost at the end of the scan. The radiation 54 from the illumination slit 56 passes through the pinhole 52 in the mask on a reticle 58. The projection lens 60 produces a focused image of the pinhole as a spot of radiation at point 50 at the wafer level. Measurements of the intensity distribution of a defocused image of the pinhole are performed at the measurement plane 224. The intensity distribution at this plane is substantially representative for the intensity distribution at the pupil of the projection lens 60. As shown in FIG. 12, during a scan exposure, the reticle 58 moves to the right and the wafer 64 moves in the opposite direction to the left. FIG. 12 is purely schematic and does not fully include the effect of the demagnification of the lens 60 and the corresponding velocity ratio of the reticle 58 and the wafer 64. When performing pupil measurements according to the present invention, it is not necessary to have a wafer 64 present at the wafer level; an aerial image of the pinhole can be formed in space at point 50 and the intensity distribution measurements performed by a sensor at the defocused measurement plane 224.

Figure 13:
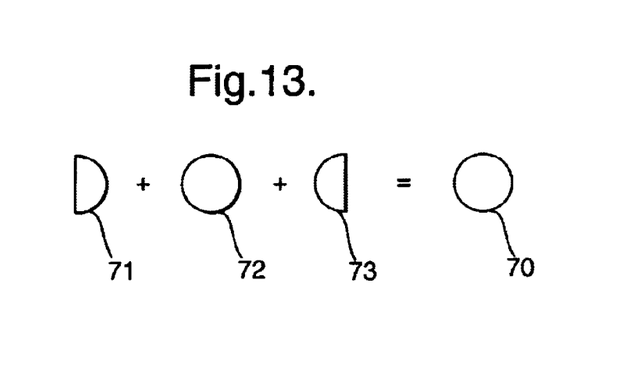
FIG. 13 is a schematic illustration of pupil integration during a scan as shown in FIG. 12.

At the bottom of FIG. 12 are illustrated plan views of the spatial intensity distributions at the measurement plane 224 for the different snapshots of the scan. These distributions correspond to the intensity distribution at the pupil of the projection lens, and to the angular intensity distributions at wafer level. As can be seen, the filling of the pupil with radiation of the projection beam as seen by a point on the wafer changes significantly during a scan. The effective intensity distribution at the pupil as seen by a point on the wafer during a complete scan is the sum of the intensity distributions as seen at each point in time during the scan. This is shown schematically in FIG. 13 which shows the effective pupil intensity distribution 70 formed from the sum of momentary or static pupil intensity distributions 71, 72, 73 at different moments during the scan. For a continuous scan, the sum becomes an integration, rather than a discrete sum. The effective pupil intensity distribution is also known as the "scanning pupil" or "integrated pupil". For reducing image anomalies of a projected pattern the scanning pupil is the key parameter, rather then the pupil intensity distribution at any particular snapshot during a scan. In the example shown in FIG. 13, the scanning pupil is equal to the static pupil intensity distribution at the centre of the field, however this is an ideal situation, and this is not necessarily the case, so it is important to be able to measure the scanning pupil.

There are a number of ways to measure the scanning pupil:

1) A scan may be mimicked, by positioning the or a pinhole at a number of positions in the scanning direction. For each position, the intensity distribution at the defocused measurement plane 224 is measured (using any suitable method, e.g. using a TIS sensor, a CCD or a radiation sensitive resist). The scanning pupil is then approximated by integrating, for example numerically in the case of real time electronic detection, the measured intensity distributions.

2) A pinhole is scanned at reticle level. The intensity distribution at the defocused measurement plane is measured during this scan.

2.1 A CCD array at the measurement plane is simultaneously scanned. The image on the CCD array during the scan is recorded. Afterwards, the scanning pupil can be calculated by integration of the pupil intensity distributions as measured during a scan.

2.2 Using a TIS (spot sensor), only one pupil coordinate can be measured at a time. So prior to each scan, one pupil position is chosen and both the pinhole and the TIS are scanned across the illumination slit field. The position of the TIS relative to the pinhole is fixed. The irradiance on the TIS during the whole scan is recorded. This complete scan is done for each pupil coordinate. Afterwards, the scanning pupil can be calculated by integration of the pupils as measured during a scan.

3) A scan is performed simultaneously with both a pinhole and a defocused resist-coated wafer. The intensity distribution beneath the pinhole, in the measurement plane 224 is imaged in the resist. The resist intrinsically performs the integration (the dose at each position, during the scan, simply adds up). Thus the image recorded in the resist is the scanning pupil. Other integrating measurement devices, apart from resist, may also be used.

The features of the preceding embodiments may also be used as appropriate with the third embodiment. For example, although FIG. 12 shows the pinhole created at reticle level, and the defocus is created at wafer level (the measurement plane 224 is displaced from the wafer level in a direction away from the projection lens 60), alternatives include: creating the pinhole at wafer level; creating the defocus at reticle level by axial displacement of the pinhole (such that the measurement plane can, optionally, coincide with the wafer level); and using positive or negative defocus (for example positioning the measurement plane above wafer level in the direction towards the lens 60). Similarly, the pinhole can be a small transmissive or non-transmissive region comprising a region of opposite (or different) transmissivity, and diffractive elements, such as subsidiary dots, gratings or diffusers, can be used with the pinhole.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any subcombination.

Although this text has concentrated on lithographic apparatus and methods whereby a mask is used to pattern the radiation beam entering the projection system, it should be noted that the invention presented here should be seen in the broader context of lithographic apparatus and methods employing generic "patterning structure" to pattern the said radiation beam. The term "patterning structure" as here employed refers broadly to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. Besides a mask (whether transmissive or reflective) on a mask table, such patterning structure include the following exemplary embodiments:

(1) A programmable mirror array. One example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field or by employing piezoelectric means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic/computer means. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference.

(2) A programmable LCD array. An example of such a construction is given in United States Patent U.S. Pat. No. 5,229,872, which is incorporated herein by reference.

Any reference to the term "mask" in the Claims and/or Description should be interpreted as encompassing the term "patterning structure" as hereabove described.

While specific embodiments of the invention have been described above, it will be appreciated that the invention may be practised otherwise than as described.

What is claimed is:

1. A method of operating a lithographic projection apparatus comprising:
    forming at least one spot of radiation from at least a portion of a projection beam in the apparatus;
    measuring, with at least one sensor placed at an out of focus position with respect to said spot, a spatial variation in intensity of defocused radiation from the spot or from an image of the spot; and
    determining properties of said apparatus from the spatial variation.

2. A method according to claim 1, wherein the at least one spot is formed at at least one of the mask plane and the substrate plane.

3. A method according to claim 1, wherein the at least one spot is formed by the beam passing through a pinhole.

4. A method according to claim 1, wherein the at least one spot comprises a small substantially transmissive region surrounded by a substantially non-transmissive region.

5. A method according to claim 1, wherein the at least one spot comprises a small substantially non-transmissive region surrounded by a substantially transmissive region.

6. A method according to claim 1, further comprising generating radiation at particular angles using, at the at least one spot, at least one radiation manipulation effect selected from the group of radiation manipulation effects comprising diffraction, scattering and diffusion of radiation.

7. A method according to claim 1, wherein the properties of the apparatus comprise at least one of:
    for a pupil in the apparatus, at least one of a shape, symmetry, fine structure and centering of the angular intensity distribution of radiation with respect to an NA-diaphragm in said apparatus,
    at least one of a shape and a size of an NA-diaphragm in the apparatus,
    an angular dependence of radiation transmission in a projection system of the apparatus, and
    an angular intensity distribution at one of a mask plane and a substrate plane, an alignment of optical components in the apparatus.

8. A method according to claim 1, further comprising scanning at least one of the spot and the sensor during the measuring.

9. A method according to claim 1, further comprising integrating the intensity measured by the sensor.

10. A method according to claim 1, further comprising adjusting the apparatus to compensate for deviation from optimal of at least one of the determined properties.

11. A lithographic projection apparatus for imaging a mask pattern in a mask onto a substrate provided with a radiation-sensitive layer, the apparatus comprising:
    a radiation system, to provide a projection beam of radiation;
    a first object table to hold a mask at a mask plane;
    a second object table to hold a substrate at a substrate plane;
    a projection system to image irradiated portions of the mask onto target portions of the substrate;
    at least one spot formation device to form at least one spot of radiation from at least a portion of said projection beam in said apparatus; and
    at least one radiation sensor placed at an out of focus position with respect to said at least one spot, to measure a spatial variation in intensity of defocused radiation from the at least one spot or an image thereof.

12. An apparatus according to claim 11, wherein said at least one spot formation device comprises at least one pinhole located at one of the mask plane and the substrate plane.

13. An apparatus according to claim 12, wherein the at least one pinhole further comprises subsidiary dots, of size substantially equal to a wavelength of the radiation.

14. An apparatus according to claim 12, wherein the at least one pinhole further comprises a diffraction grating.

15. An apparatus according to claim 12, wherein the at least one pinhole further comprises an element to provide an angular distribution of radiation using at least one radiation manipulation effect selected from the group of radiation manipulation effects including diffraction, scattering and diffusion of radiation.

16. An apparatus according to claim 11, wherein, in use, the at least one sensor is defocused by a distance greater than a size of the respective spot.

17. An apparatus according to claim 15, wherein the size of the spot is approximately 1% of the image field area or less.

18. An apparatus according to claim 11, wherein the at least one sensor comprises a photodiode with small detection area.

19. An apparatus according to claim 11, wherein the at least one sensor comprises a charge-coupled device (CCD).

20. An apparatus according to claim 11, wherein the at least one sensor further comprises a lens.

21. An apparatus according to claim 11, wherein the at least one sensor is moveable so as to perform a scan of the radiation emanating from the spot.

22. An apparatus according to claim 11, further comprising a calculation unit for determining properties of the apparatus from the measurements taken by the at least one sensor.

23. An apparatus according to claim 21, further comprising actuators constructed and arranged to adjust said apparatus to at least partially compensate for deviation from optimal of any of the determined properties based on signals from said calculating unit.

24. A method of manufacturing a device including operating a lithographic projection apparatus comprising:
- a radiation system, to provide a projection beam of radiation;
- a first object table to hold a mask at a mask plane;
- a second object table to hold a substrate at a substrate plane;
- a projection system to image irradiated portions of the mask onto target portions of the substrate;
- at least one spot formation device to form at least one spot of radiation from at least a portion of said projection beam in said apparatus; and
- at least one radiation sensor placed at an out of focus position with respect to said at least one spot, to measure a spatial variation in intensity of defocused radiation from the at least one spot or an image thereof.

25. A device manufactured according to the method of claim 24.

26. A method of operating a lithographic projection apparatus comprising:
- forming at least one spot of radiation from at least a portion of a projection beam in the apparatus;
- measuring a spatial variation in intensity of defocused radiation from said spot with at least one sensor placed at an out of focus position with respect to said spot, the at least one sensor being constructed and arranged to perform real time electronic analysis of an intensity distribution; and
- determining properties of said apparatus from the measured spatial variation.

* * * * *